(12) United States Patent
Sabate et al.

(10) Patent No.: US 12,206,394 B2
(45) Date of Patent: Jan. 21, 2025

(54) GATE DRIVER CORELESS TRANSFORMERS FOR MAGNETIC RESONANCE IMAGING POWER ELECTRONICS

(71) Applicant: GE Precision Healthcare LLC, Waukesha, WI (US)

(72) Inventors: Juan Antonio Sabate, Gansevoort, NY (US); Eladio Clemente Delgado, Burnt Hills, NY (US)

(73) Assignee: GE Precision Healthcare LLC, Waukesha, WI (US)

( * ) Notice: Subject to any disclaimer, the term of this patent is extended or adjusted under 35 U.S.C. 154(b) by 0 days.

(21) Appl. No.: 18/446,651

(22) Filed: Aug. 9, 2023

(65) Prior Publication Data

US 2023/0387905 A1  Nov. 30, 2023

Related U.S. Application Data

(62) Division of application No. 17/715,451, filed on Apr. 7, 2022, now Pat. No. 11,777,487.

(51) Int. Cl.
*H01F 27/28* (2006.01)
*H03K 17/16* (2006.01)

(52) U.S. Cl.
CPC ......... *H03K 17/16* (2013.01); *H01F 27/2804* (2013.01); *H01F 2027/2809* (2013.01)

(58) Field of Classification Search
CPC ................ H03K 17/16; H01F 27/2804; H01F 2027/2809; H02M 7/4818; H02M 7/4815
See application file for complete search history.

(56) References Cited

U.S. PATENT DOCUMENTS

| 10,317,484 B2 | 6/2019 | Kanakasabai et al. |
| 10,809,326 B2 | 10/2020 | Wang et al. |
| 11,018,533 B2 | 5/2021 | Kanakasabai et al. |
| 2007/0024255 A1* | 2/2007 | Yasumura ........... H02M 3/3385 363/16 |
| 2020/0007044 A1 | 1/2020 | Sato et al. |

OTHER PUBLICATIONS

Gottschlich, Matthias Schafer, et al.; "A Galvanically Isolated Gate Driver with Low Coupling Capacitance for Medium Voltage SiC MOSFETs", research project funded by the German Federal Ministry of Research and Education (03SF0489); 2016, pp. 1-8.
(Continued)

*Primary Examiner* — Jung Kim
(74) *Attorney, Agent, or Firm* — Fletcher Yoder, P.C.

(57) ABSTRACT

A gate driver circuit includes an isolated gate driver power supply circuit. The isolated gate driver power supply circuit includes a coreless transformer including a primary winding and a secondary winding. The secondary winding is wound about a toroid-shaped, non-magnetic body and the primary winding is a single turn primary winding to reduce capacitance coupling between the primary winding and the secondary winding. The isolated gate driver power supply circuit also includes a resonance converter coupled to the coreless transformer, wherein the resonance converter is configured to enable the isolated gate driver power supply circuit to generate an output voltage independent of load.

8 Claims, 18 Drawing Sheets

(56) References Cited

OTHER PUBLICATIONS

Yan, Ning, et al.; "Design Analysis for Current-transformer Based High-Frequency Auxiliary Power Supply for SiC-based Medium Voltage Converter Systems", downloaded Jul. 22, 2020 from IEEE Xplore; pp. 1390-1397.

Byron, Kelly, et al.; "Wireless Power Transfer Compatibility and Noise Issues in MRI", Proc. Intl. Soc. Mag. Reson. Med. (2019); pp. 1-3.

* cited by examiner

GATE DRIVER CORELESS TRANSFORMERS FOR MAGNETIC RESONANCE IMAGING POWER ELECTRONICS

CROSS-REFERENCE TO RELATED APPLICATION

This application is a Divisional application of U.S. patent application Ser. No. 17/715,451, entitled "GATE DRIVER CORELESS TRANSFORMERS FOR MAGNETIC RESONANCE IMAGING POWER ELECTRONICS", filed Apr. 7, 2022, which is herein incorporated by reference in its entirety.

BACKGROUND

The subject matter disclosed herein relates to a coreless transformer and, in particular, a coreless transformer for a gate driver for utilization with a magnetic resonance imaging (MRI) system.

To operate power electronics in a high magnetic field environment utilization of ferromagnetic components that can saturate and lose their functionality should be avoided. Gate drivers are a key element for power converters. Gate drivers need transformers to provide isolated voltages to drive power semiconductor modules (IGBTs or MOSFETs) operating at high voltage, on the order of 1000 to 2500 volts (V) for gradient drivers. At the same time the transformers provide the isolation, the high dv/dt associated with the power semiconductors drive high currents through the primary to secondary capacitance and these currents create a lot of common mode noise on all the low voltage circuits. The increasing use of wide bandgap power semiconductors, SiC and GaN, for higher efficiency and power density has led to faster on/off transitions and consequently higher dv/dt, which has further increased the need to minimize the transformer parasitic capacitance across the insulation. However, the direct consequences of eliminating ferromagnetic cores are coupling reduction and increased transformer size for a given power.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible forms of the subject matter. Indeed, the subject matter may encompass a variety of forms that may be similar to or different from the embodiments set forth below.

In one embodiment, a gate driver circuit is provided. The gate driver circuit includes an isolated gate driver power supply circuit. The isolated gate driver power supply circuit includes a coreless transformer including a primary winding and a secondary winding. The secondary winding is wound about a toroid-shaped, non-magnetic body and the primary winding is a single turn primary winding to reduce capacitance coupling between the primary winding and the secondary winding. The isolated gate driver power supply circuit also includes a resonance converter coupled to the coreless transformer, wherein the resonance converter is configured to enable the isolated gate driver power supply circuit to generate an output voltage independent of load.

In another embodiment, a gate driver circuit is provided. The gate driver circuit includes an isolated gate driver power supply circuit. The isolated gate driver power supply circuit includes a coreless transformer including a primary winding and a secondary winding embedded in a printed circuit board, wherein the primary winding and the secondary winding are arranged in a non-overlapping arrangement to reduce capacitance coupling between the primary winding and the secondary winding. The isolated gate driver power supply also includes a resonance converter coupled to the coreless transformer, wherein the resonance converter is configured to compensate for leakage inductance of the coreless transformer and to enable the isolated gate driver power supply circuit to generate an output voltage independent of load.

In a further embodiment, a gate driver circuit is provided. The gate driver circuit includes an isolated gate driver power supply circuit. The isolated gate driver power supply circuit includes a coreless transformer including a primary winding and a secondary winding, wherein both the primary winding and the secondary winding are wound about a toroid-shaped, non-magnetic body in a multi-filar arrangement to reduce capacitance coupling between the primary winding and the secondary winding. The isolated gate driver power supply circuit also includes a resonance converter coupled to the coreless transformer, wherein the resonance converter is configured to compensate for leakage inductance of the coreless transformer and to enable the isolated gate driver power supply circuit to generate an output voltage independent of load

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

Figure 1:
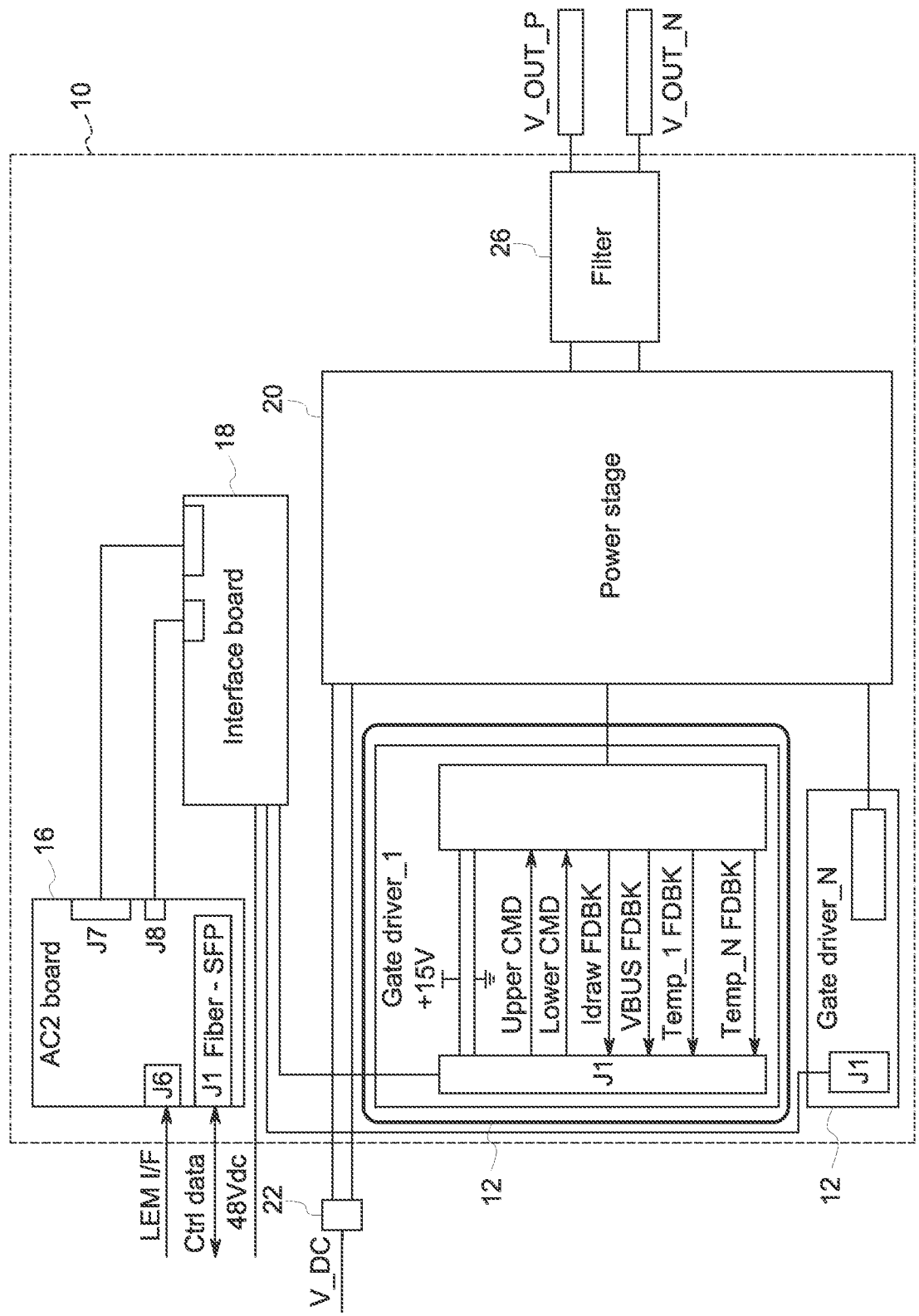
FIG. 1 is a schematic diagram of an embodiment of a gradient driver system with gate drivers, in accordance with aspects of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

The present disclosure is directed to a gate driver (e.g., as part of a gradient driver system) that can be reliably and safely utilized for an MRI system. The gate driver includes an isolated gate driver power supply circuit that includes a coreless transformer (e.g., air core transformer). Thus, the gate driver does not include any ferromagnetic material and is compatible with MRI functional frequencies. In certain embodiments, the coreless transformer includes a primary winding and a secondary winding arranged to provide sufficient insulation, minimal interwinding capacitance, and acceptable magnetic coupling for power delivery with minimum susceptibility to switch voltage changing rate (dv/dt). In certain embodiments, the isolated gate driver power supply circuit may include a resonance converter coupled to the coreless transformer to compensate for leakage inductance and generate an output voltage independent of load. In certain embodiments, the coreless transformer may be include a toroidal winding about an annular-shaped non-ferromagnetic body. In certain embodiments, the coreless transformer is a planar transformer embedded in a printed circuit board. The size of the transformer can be reduced to practical sizes for the power needs (e.g., 4 to 10 Watts (W)) when driving it with high switching frequency at the multi-megahertz (MHz) level. The driving circuit can be kept very efficient utilizing a circuit that avoids reverse recovery losses for the diodes with soft switching and has low losses operating at high frequency. Overall, the gate driver provides high power efficiency and load insensitivity at lower cost.

FIG. 1 is a schematic diagram of an embodiment of a gradient driver (e.g., gradient amplifier) system 10 with gate drivers 12. The gradient driver system 10 includes a controller or control board 16 coupled to multiple gate drivers 12 via an interface board 18. The gate drivers 12 are electronic circuits coupling the control electronics (e.g., controller 16) to power semiconductor devices to enable control functions such as turning on/off the power devices. As described, in greater detail below, the gate drivers 12 each include an isolated gate power supply that includes a coreless transformer (e.g., air core transformer). The gate drivers 12 are coupled to a power stage 20. The power stage 20 includes power semiconductor devices (including wide-bandgap semiconductor transistors such a as a metal-oxide-semiconductor field effect transistor (MOSFET), an insulated-gate bipolar transistor (IGBT), or other semiconductor power devices (e.g., highly mobile semiconductor electron semiconductor (HEMT) such as a gallium nitride transistor (e.g., GaN MOSFET)). The number of gate drivers 12 coupled to the power stage 20 to control switching of the semiconductor power devices may vary. In addition, a direct current (DC) power supply 22 is coupled to the power stage 20. The power stage is 20 coupled to a filter 26 (e.g., power filter) that filters the power line to remove ripple signals. The gate drivers 12 are configured to be utilized reliably and safely in presence of a high magnetic field.

Figure 2:
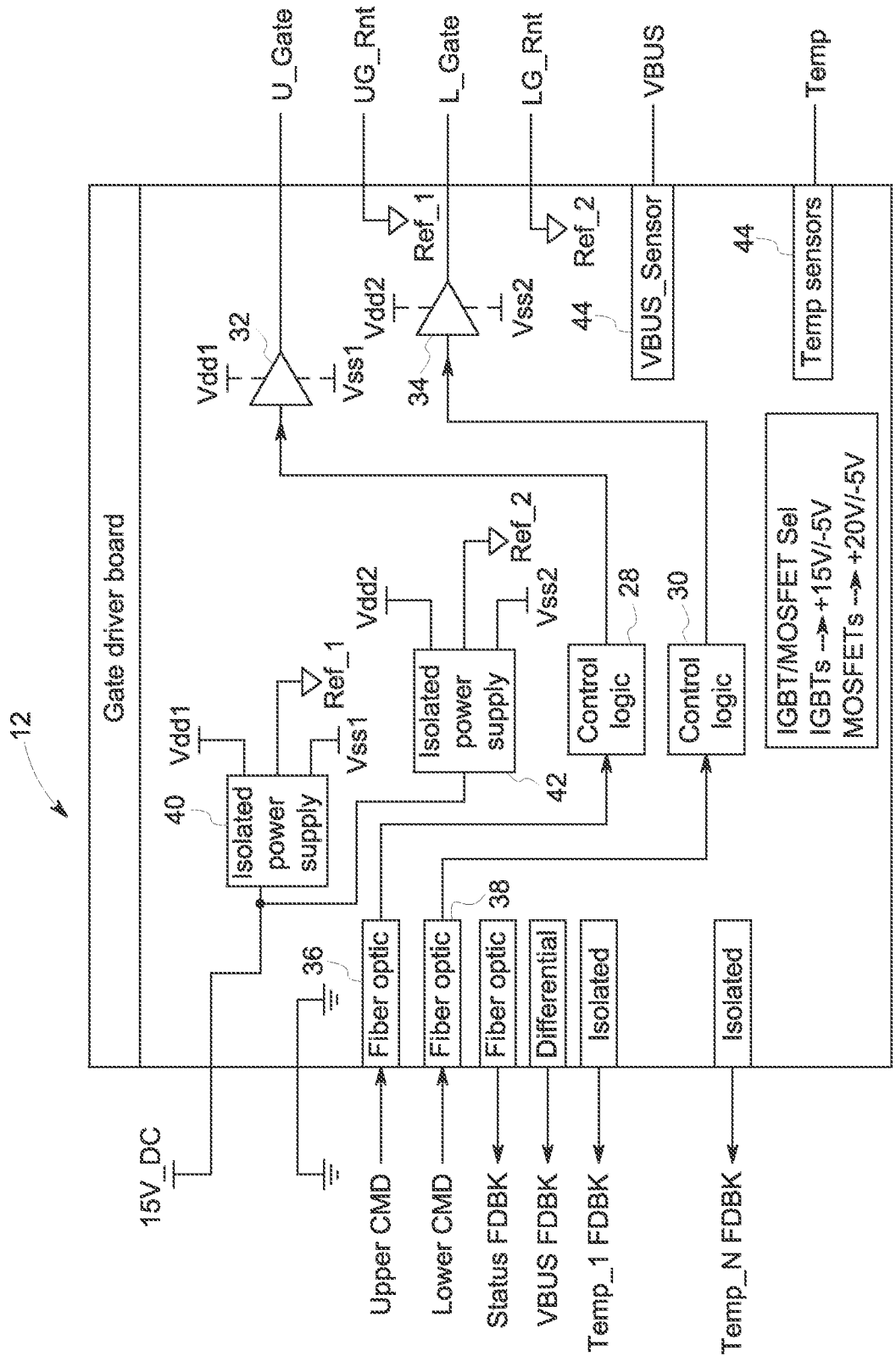
FIG. 2 is a block diagram of an embodiment of a gate driver in FIG. 1, in accordance with aspects of the present disclosure.

FIG. 2 is a block diagram of an embodiment of the gate driver 12 (or gate driver board) in FIG. 1. The gate driver 12 includes control logic 28, 30 coupled to the drivers 32, 34 for controlling the upper and lower gates, respectively, of the upper and lower power semiconductor devices to turn the devices on and off. The control logic 28, 30 are coupled to the fiber optics 36, 38, respectively. The gate driver 12 also includes isolated power supplies (e.g., isolated gate power supplies) 40, 42 that provide the voltage level (e.g., secondary voltages) for the control logic and power to drive (e.g., to charge and discharge) the gate of the power semiconductor device. The power supplies 40, 42 are high voltage isolated to avoid short circuit of the power stage. As depicted, the gate driver 12 may include sensors 44 (e.g., temperature sensors, VBUS sensor, etc.) and provide feedback to the controller 16 via fiber optics, isolated lines, differential lines, or other means.

Figure 3:
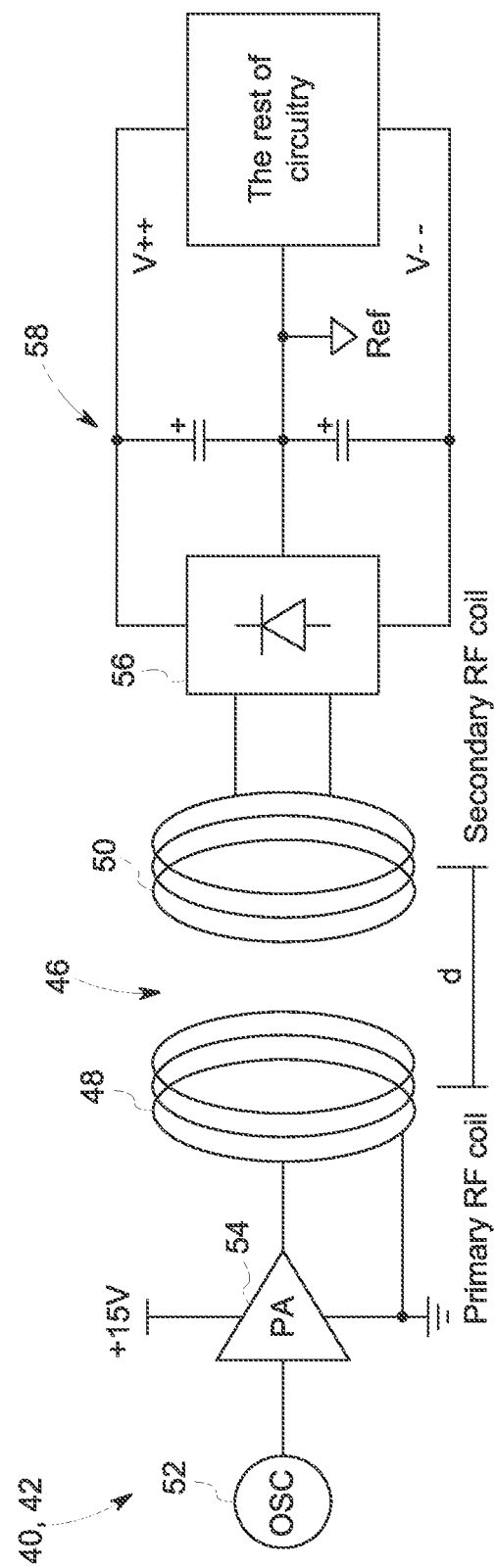
FIG. 3 is a schematic diagram of an embodiment of an isolated power supply of FIG. 2.

FIG. 3 is a schematic diagram of an embodiment of the isolated power supply 42 of FIG. 2. As depicted, each isolated power supply 40, 42 includes a coreless transformer 46 (e.g., air core transformer) lacking ferromagnetic material that includes a first coil 48 (e.g., primary radiofrequency (RF) coil) magnetically coupled (e.g., inductively coupled) to a second coil 50 (e.g., secondary RF coil). In certain embodiments, the transformer 46 may include a different number of windings or coils. As disclosed below, the coils 48, 50 may be arranged to have low capacitance coupling and very low interwinding capacitances and to provide an acceptable magnetic coupling, sufficient insulation, and minimum susceptibility to switch voltage changing rate (dv/dt). As depicted, the transformer 46 (in particular, coil 48) is coupled to an oscillator 52 and a power amplifier 54. The oscillator 52 converts the power from DC to AC. The power amplifier 54 amplifies the power that is provided to the load. As depicted, the transformer 46 is coupled to a rectifier 56 and additional circuitry 58. The rectifier 56 converts AC to DC.

As described in greater detail below, the coreless transformer 46 may include a single turn primary winding for the first coil 48 and a secondary winding for the second coil 50 wound about a toroid-shaped, non-magnetic body. In another embodiment, the coreless transformer 46 may include a single turn primary winding for the first coil 48 and multiple secondary windings separately wound about respective toroid-shaped, non-magnetic bodies. In a further embodiment, the coreless transformer 46 may include a primary winding for the first coil 48 and at least one secondary winding for the second coil wrapped in a multifilar arrangement around the same toroid-shaped, non-magnetic body. In a further embodiment, a primary winding for the first coil 48 and a secondary winding for the second coil 50 embedded in a printed circuit board. In these embodiments, the coreless transformers 46 include have low primary inductance and significant leakage inductance on the secondary that can be compensated via a resonance converter, as described below. The resonance converter is configured to enable zero voltage switching by the isolated gate driver power supply circuit. In certain embodiments, an inductor (e.g., coreless or air inductor) may be coupled in series with the primary winding to limit the primary current.

Figure 4:
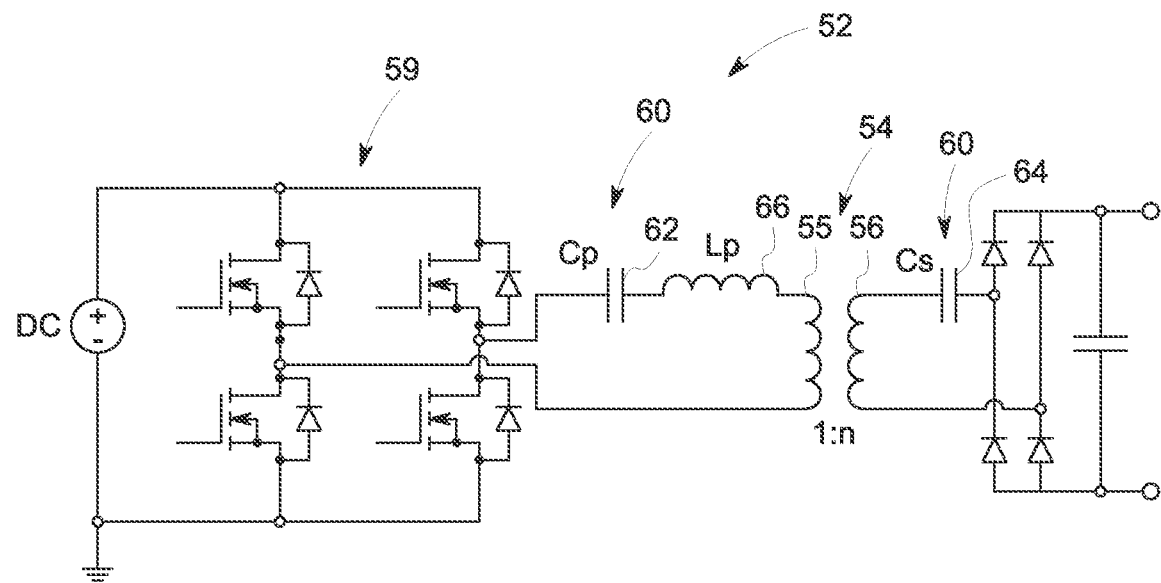
FIG. 4 is a schematic diagram of an embodiment of a gate driver power supply topology, in accordance with aspects of the present disclosure.

FIG. 4 is a schematic diagram of an embodiment of a gate driver power supply topology 52 (e.g., isolated gate driver power supply circuit). The gate driver power supply 52 includes a coreless transformer 54 including a primary coil or winding 55 and a secondary coil or winding 56. The primary winding 55 and the secondary winding 56 are arranged with respect to each other to reduce capacitance coupling between themselves. The coreless transformer 54 includes a low primary inductance and significant leakage inductance on the secondary. A full bridge circuit (59) with a low voltage dc (e.g., 15 V) is utilized to drive the transformer primary (e.g., input side) in the gate driver power supply topology 52. The gate driver power supply 52 includes a resonant converter 60 configured to compensate for leakage inductance of the coreless transformer 54 to enable zero voltage switching. The resonant converter is also configured to enable the isolated gate driver power supply circuit 52 to generate an output voltage independent of load.

The resonant converter 60 includes compensation capacitors such as a first capacitor 62 (e.g., primary capacitor (Cp)) and a second capacitor 64 (secondary capacitor (Cs)) respectively coupled to the primary winding 55 and the secondary winding 56 in series. The secondary capacitor 64 is configured to compensate for the secondary leakage inductance. The secondary capacitor 64 is configured to be resonant with the secondary at the switching frequency (fsw). The primary capacitor 62 is configured to have a primary resonance lower than the switching frequency so that the bridge 59 has an inductive load and then operates with zero voltage switching (ZWS). The low switching losses work well with the bridge running at, e.g., approximately 2.5 megahertz (MHz) (more specifically, 2.489 MHz). As discussed in greater detail below, a wide-bandgap semiconductor transistor of isolated gate driver power supply circuit 52 and the resonant converter 60 are configured to enable switching by the isolated gate driver power supply circuit 52 at switching frequencies in the MHz range that lack harmonics that coincide with an imaging frequency during a magnetic resonance imaging scan.

As depicted in FIG. 4, a coreless (e.g., air core) inductor 66 (Lp) is coupled to the primary winding 55 in series. The inductor 66 is configured to limit a current of the primary winding 55. The inductor 66 may have an inductance of approximately 5.5 microhenry (µH).

The coreless transformer 54 has an interwinding capacitance (cps) of less than 5 picofarads (pF) to deal with the high dv/dt of the switching while providing enough coupling to deliver needed power. The coreless transformer 54 has relatively low coupling (e.g., approximately 0.4 coupling coefficient (k)). However, the leakage inductance compensation (e.g., series-series compensation) via the resonance converter 60 enables effective and efficient power transfer and low voltage drop. The configurations of the coreless transformer 54 below fit these criteria.

Figure 5:
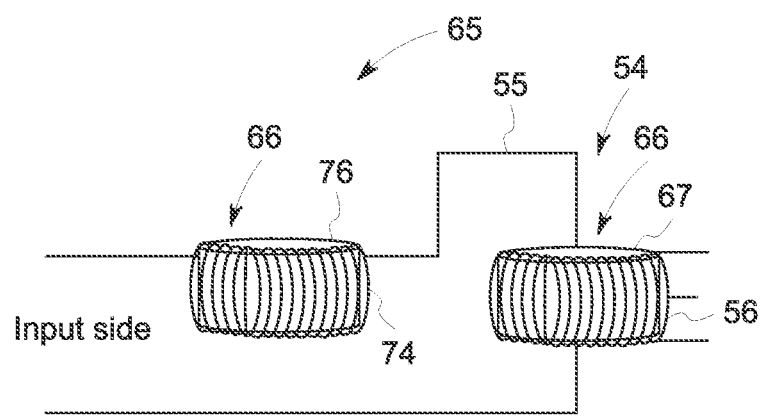
FIG. 5 is a schematic diagram of an embodiment of a circuit (e.g., having a single output) with a coreless transformer coupled in series with a coreless inductor, in accordance with aspects of the present disclosure.
Figure 6:
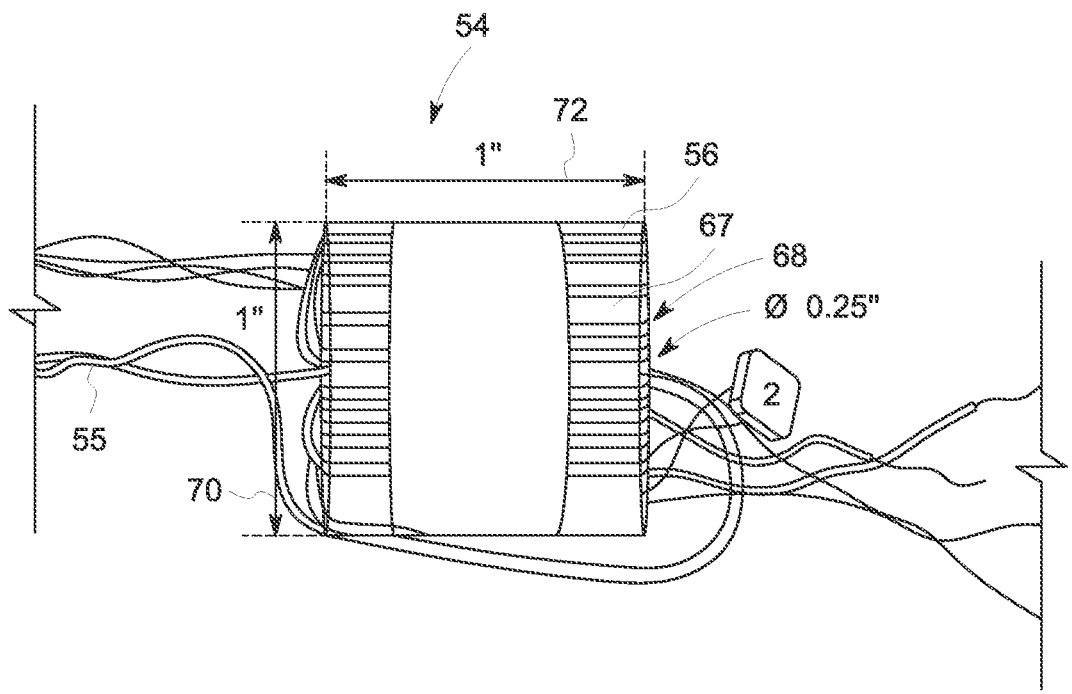
FIG. 6 is an image of an implementation of the coreless transformer in FIG. 5, in accordance with aspects of the present disclosure.

FIG. 5 is a schematic diagram of an embodiment of a circuit 65 (e.g., having a single output) with the coreless (e.g., air core) transformer 54 (e.g., current transformer) coupled in series with the coreless (e.g., air core) inductor 66. The coreless transformer 54 includes the single turn primary winding 55. The coreless transformer 54 also includes the secondary winding 56 (e.g., toroidal winding) wound about a toroid-shaped, non-magnetic body 67. The number of turns of the secondary winding 56 may vary. In certain embodiments, the number of turns of the secondary winding 56 may be 60. The toroidal geometry confines magnetic flux minimizing leakage, reducing radiation, and reducing interaction with close metal enclosures. The primary winding 55 passes through an opening 68 of the body 67. The primary winding 55 and the secondary winding 56 are arranged with respect to each other to reduce capacitance coupling between themselves. FIG. 6 depicts an actual physical implementation of the coreless transformer 54 (e.g., with the secondary winding 56 having 60 turns). As depicted in FIG. 6, the body 67 has a width or outer diameter 70 of 1 inch (2.54 centimeters (cm)) and a height 72 of 1 inch (2.54 cm), while the opening 66 has an inner diameter of 0.25 inches (0.635 cm). Returning to FIG. the coreless inductor 66 includes a coil 74 (e.g., toroidal winding) wound about a toroid-shaped, non-magnetic body 76. The coreless inductor 66 is configured to limit a current of the primary winding 55. The bodies 67, 76 may be made of polytetrafluoroethylene (PTFE), fiber glass, or some other non-conductive plastic, high temperature resistant plastic.

The coreless transformer 54 has an interwinding capacitance (cps) of 2.5 pF and a coupling coefficient (kps) of 0.4. The coreless transformer 54 enables voltages to be produced on the secondary capable of providing voltage of +15 V and −4 V for a gate driver using linear regulators and without exceeding the component ratings of the components at no load (e.g., less than 30 V).

Figure 7:
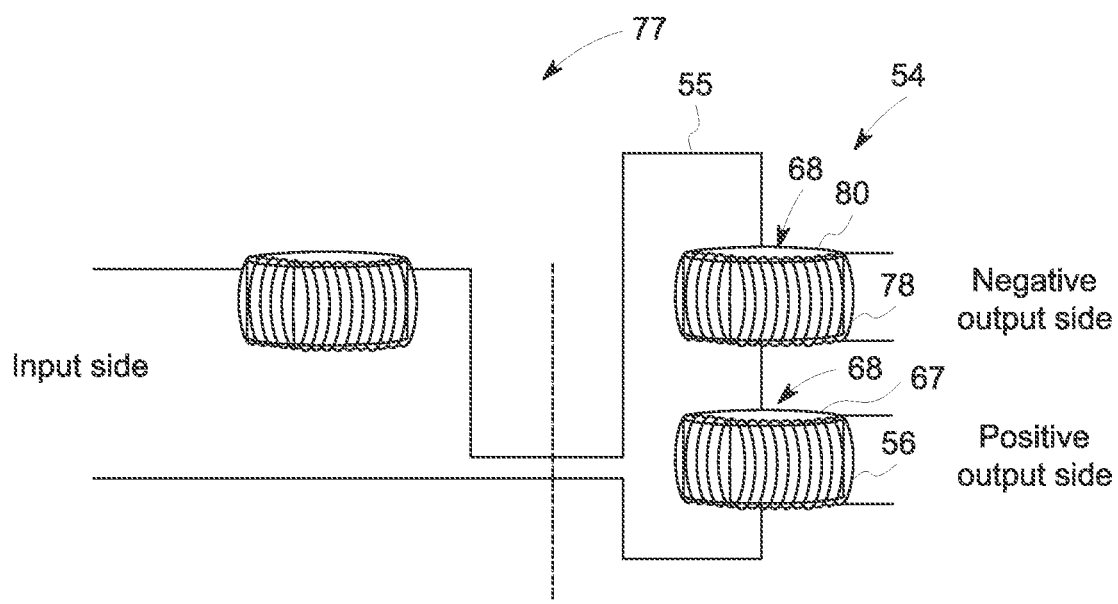
FIG. 7 is a schematic diagram of an embodiment of a circuit (e.g., having two outputs) with a coreless transformer coupled in series with a coreless inductor, in accordance with aspects of the present disclosure.

In certain embodiments, the coreless transformer 54 includes multiple secondary windings. FIG. 7 is a schematic diagram of an embodiment of a circuit 77 (e.g., having two outputs) with the coreless transformer 54 coupled in series with the coreless inductor 66. As depicted in FIG. 7, the coreless transformer 54 includes an additional secondary winding 78 (e.g., toroidal winding) wound about a separate toroid-shaped, non-magnetic body 80. The body 80 is similar to body 67 as described in FIG. 5. The number of turns of the additional secondary winding 78 may vary. In certain embodiments, the number of turns of the secondary winding 78 may be 60. The primary winding 55 passes through respective openings 68 of the bodies 67, 80. The secondary winding 56 is a high voltage winding (i.e., located on the positive voltage side) and the additional secondary winding 78 is a low voltage winding (i.e., located on the negative voltage side). The primary winding 55 and the secondary windings 56, 78 are arranged with respect to each other to reduce capacitance coupling between themselves. The coreless inductor 66 is as described in FIG. 5.

Figure 8:
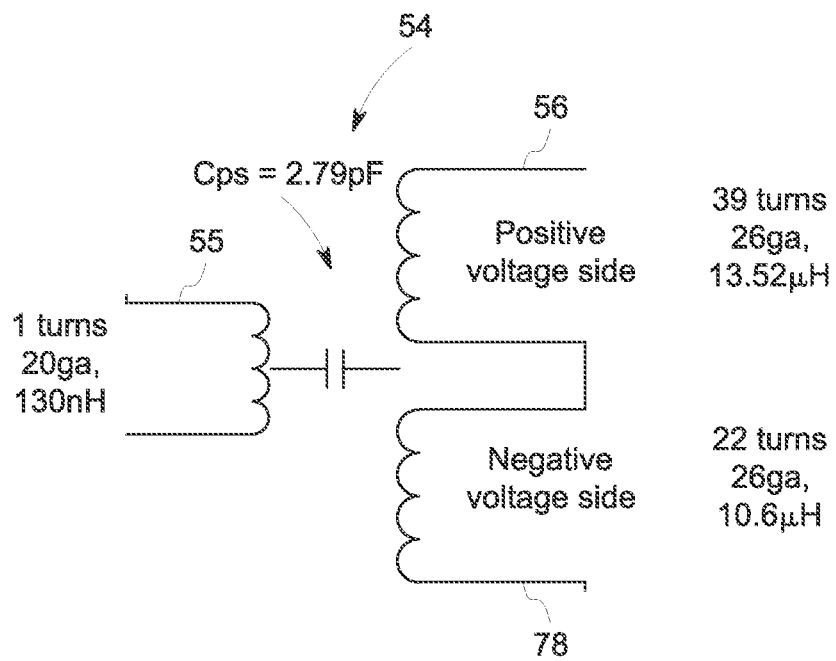
FIG. 8 is a schematic diagram of a portion of the circuit in FIG. 7 for the coreless transformer, in accordance with aspects of the present disclosure.

FIG. 8 provides more details for the coreless transformer 54 in FIG. 7. The primary winding 55 includes a single turn. In certain embodiments, the primary winding may be 20 gauge (ga) wire with an inductance of 130 nH. In certain embodiments, the secondary winding 56 includes 39 turns. The secondary winding 56 may be 26 ga wire with an inductance of 13. 52 µH. In certain embodiments, the additional secondary winding 78 includes 22 turns. The additional secondary winding 78 may be 26 ga wire with an inductance of 10.6 µH. The interwinding capacitance (cps) of the coreless transformer 54 in FIGS. 7 and 8 is 2.79 pF. The voltage gain of the coreless transformer 54 is dependent of the position of the primary winding 55 relative to both the secondary winding 56 and the additional secondary winding 78.

Figure 9:
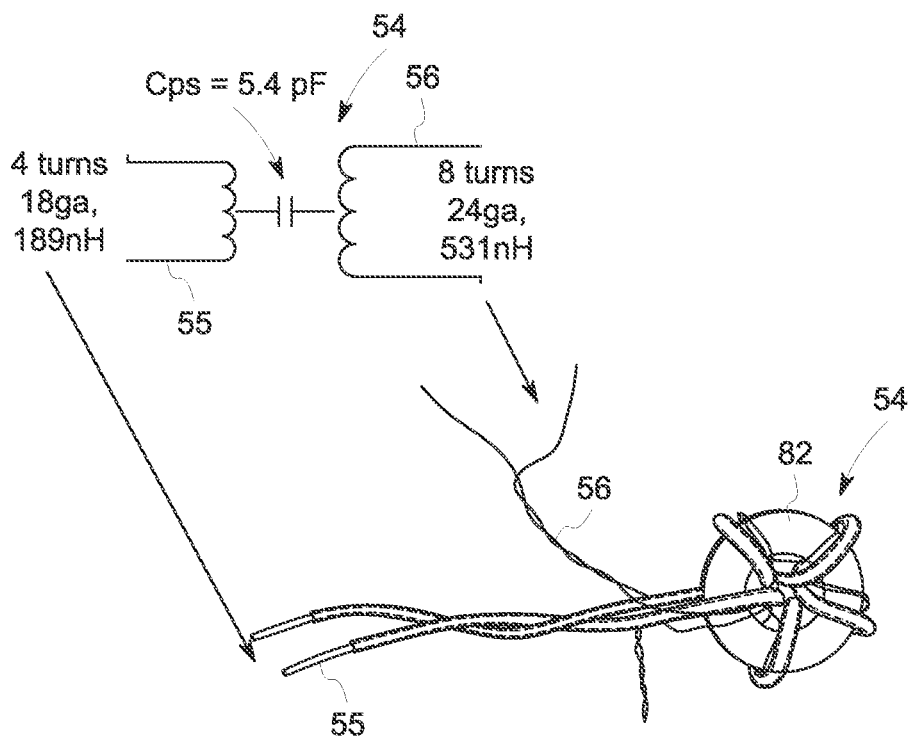
FIG. 9 is a schematic diagram of a circuit of a coreless transformer having a multi-filar winding and an image of the coreless transformer having the multi-filar winding, in accordance with aspects of the present disclosure.

FIG. 9 is a schematic diagram of a circuit of the coreless transformer 54 having a multi-filar winding and an image of the coreless transformer 54 having the multi-filar winding. As depicted in FIG. 9, the coreless transformer 54 includes a bifilar winding with both the primary winding 55 and the secondary winding 56 wound about a toroid-shaped, non-magnetic body 82. The toroid-shaped, non-magnetic body 82 is similar to those bodies described above. The primary winding 55 and the secondary winding 56 are arranged with respect to each other to reduce capacitance coupling between themselves. In certain embodiments, the coreless transformer 54 may be arranged so as to have the secondary wound in a multi-filar way, using two wires wound together, and interconnected to form 8 total secondary turns. As depicted, the primary winding 55 includes 4 turns and the secondary winding 56 includes 8 turns. The number of turns of each winding 55, 56 may vary. In certain embodiments, the primary winding 55 may be 18 ga wire with an inductance of 189 nH. In certain embodiments, the secondary winding 56 may be 24 ga wire with an inductance of 531 nH. The interwinding capacitance (cps) of the coreless transformer 54 in FIG. 9 is 5.4 pF and a coupling coefficient (kps) of 0.49. The coreless transformer 54 may include thick insulation. The bifilar toroidal winding with few turns and the thick insulation together provide low capacitance, while the toroidal winding confines the magnetic flux so that coupling is good for power transfer.

Figure 11:
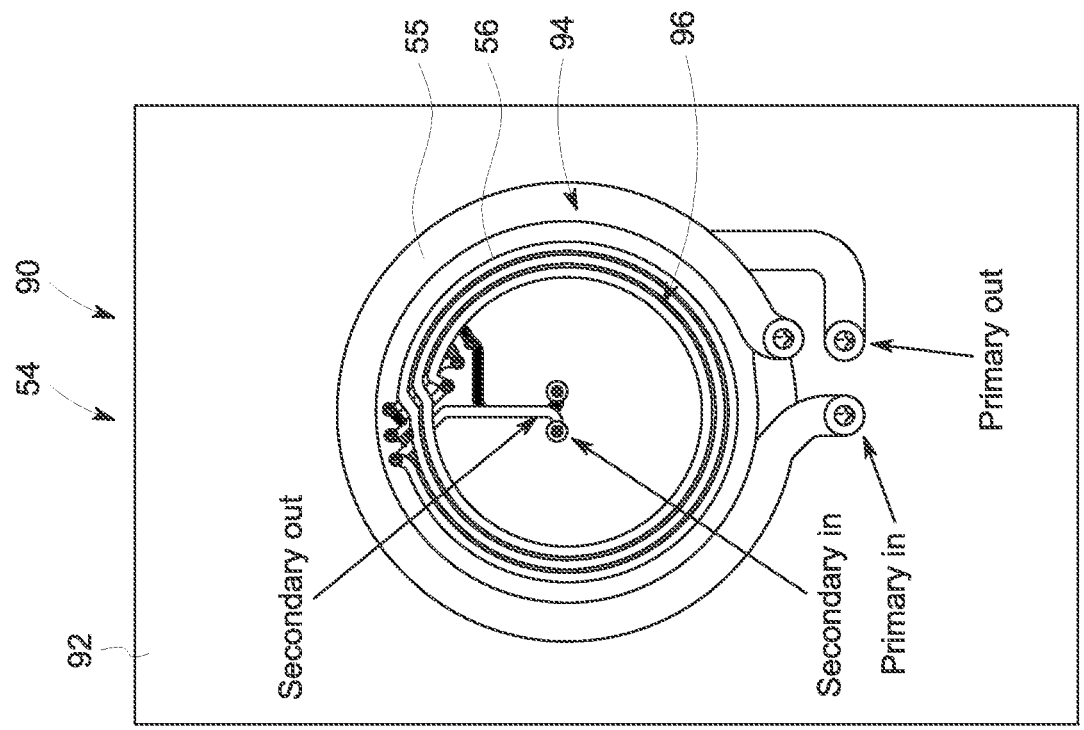
FIG. 11 is a schematic diagram of a coreless transformer having a circular shape, in accordance with aspects of the present disclosure.
Figure 10:
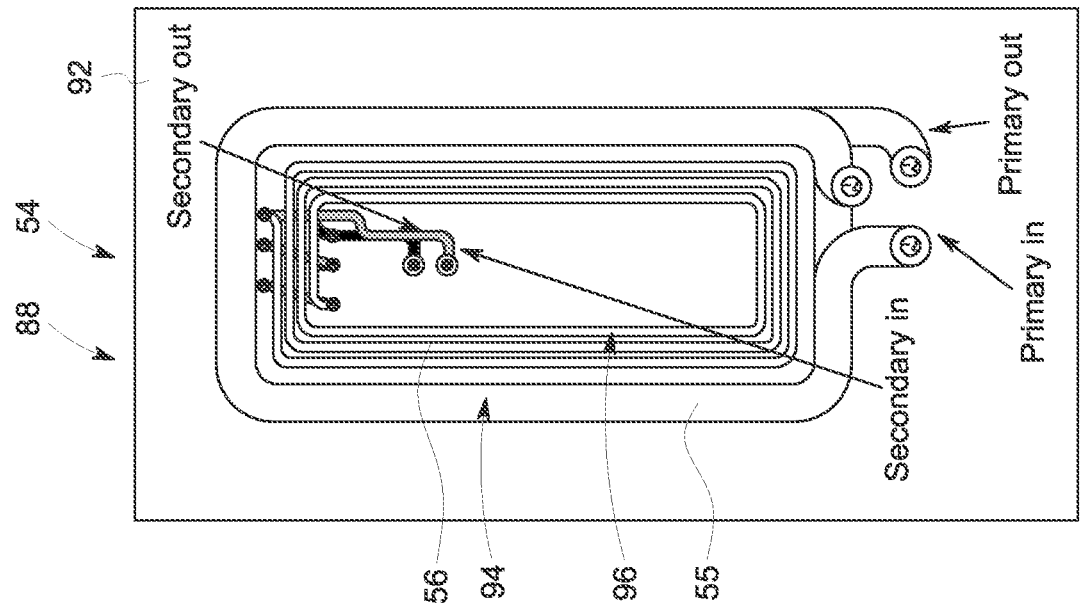
FIG. 10 is a schematic diagram of a coreless transformer (e.g., planar transformer) having a rectangular shape, in accordance with aspects of the present disclosure.

FIGS. 10 and 11 are schematic diagrams of coreless transformers 54 (e.g., planar transformers) having a rectangular shape (e.g., coreless transformer 88 in FIG. 10) and a circular shape (e.g., coreless transformer 90 in FIG. 11), respectively. Each coreless transformer 54 includes the primary winding 55 and the secondary winding 56 embedded in a printed circuit board 92. In certain embodiments, the coreless transformers 54 may be embedded in the gate driver board. In other embodiments, the coreless transformers 54 may be embedded in a separate printed circuit board and coupled or mounted to the gate driver board. As described in greater detail below, each coreless transformer includes multiple layers. The primary winding 55 is embedded in outer layers of the printed circuit board 92. The secondary winding 56 is embedded in inner layers of the printed circuit board 92. The primary winding 55 may include 2 turns. The secondary winding 56 may include 9 turns in three layers. Insulation is ensured by sizing the thickness between the outer and inner layers for the voltage needed. The locations for the ins and outs of the primary winding 55 and the secondary winding 56 are indicated in FIGS. 10 and 11. An area 94 of the primary winding 55 is greater than area 96 of the secondary winding 56 to provide high coupling for power transfer from the primary winding 55 to the secondary winding 56. The areas 94, 96 for the coreless transformers 88, 90 are the same. The coreless transformers also include low leakage magnetic flux. The primary winding 55 and the secondary winding 56 are arranged in a non-overlapping arrangement to minimize interwinding capacitance between the primary winding 55 and the secondary winding 56. The coreless transformers 54 each have an interwinding capacitance (cps) 5 pF. The coreless transformers 54 have a coupling coefficient (kps) of approximately 0.45. The coreless transformer 54 enables voltages to be produced on the secondary capable of providing voltage of +15 V and −4 V for a gate driver.

Figure 12:
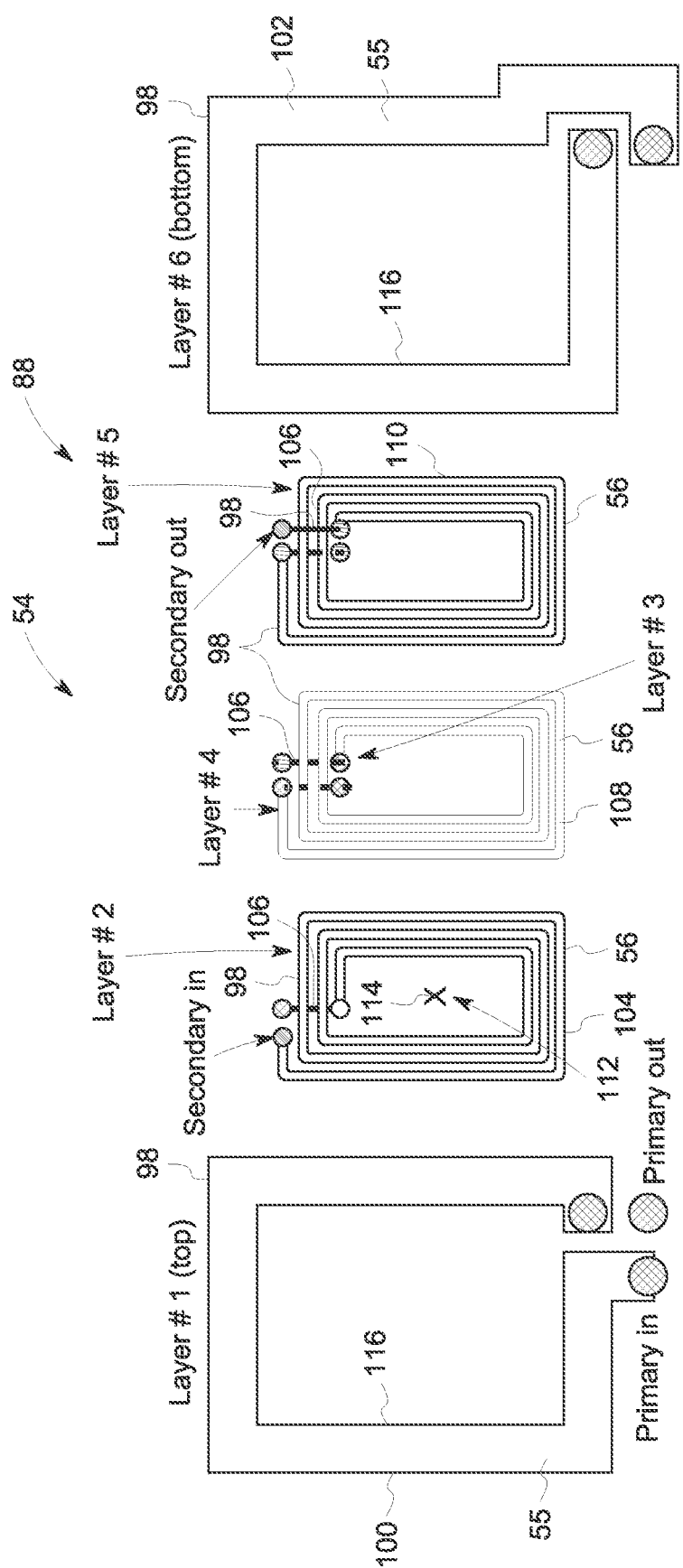
FIG. 12 is a schematic diagram of layers of the coreless transformer in FIG. 10, in accordance with aspects of the present disclosure.

FIG. 12 is a schematic diagram of layers of the coreless transformer 88 in FIG. The details of the coreless transformer 88 also apply to the coreless transformer 90 in FIG. 11. The coreless transformer 88 includes multiple layers 98 (e.g., traces). As depicted, the coreless transformer includes 6 copper layers 98. The layers 98 includes 2 outer layers: top layer 100 and bottom layer 102. The layers 98 also include 4 inner layers: inner layer 104, inner layer 106, inner layer 108, and inner layer 110. Inner layer 106 serves as a cross over layer between the inner layers 104, 106, and 108. The outer layers 100 and 102 form the primary winding 55. The inner layers 104, 108, and 110 form the secondary winding 56. Interconnections between the inner layers 104, 108, and 110 occur with buried vias except where the secondary in (on layer 104) and the secondary out (on layer 110) are indicated. The inner layers 104, 106, 108, 110 are made of 0.5 ounce copper and are approximately 0.025 inches (0.635 mm) wide. The spacing between each of the inner layers 104, 106, 108, 110 is between approximately 0.005 and 0.008 inches (0.127 and 0.203 mm). The middle of the secondary winding 56 has a window 112 of approximately 10 mm by 30 mm. The outer layers 100 and 102 are made of 1 ounce copper are approximately 0.1 inches (2.54 mm) wide. An inner edge 116 of the outer layers 100 and 102 is spaced 0.1 from a middle winding of the secondary winding 56 by 0.1 inches (2.54 mm). All corners have a radius and lack sharp turns. The primary and secondary currents of the coreless transformer 88 are 5 amperes (A) and 0.5 A, respectively. The temperature rise is 10° C. and the ambient temperature is 25° C. of the coreless transformer. The coreless transformer is 1,500 V rated.

The coreless transformers described above may be coupled to the gate driver board in different combinations.

Figure 13:
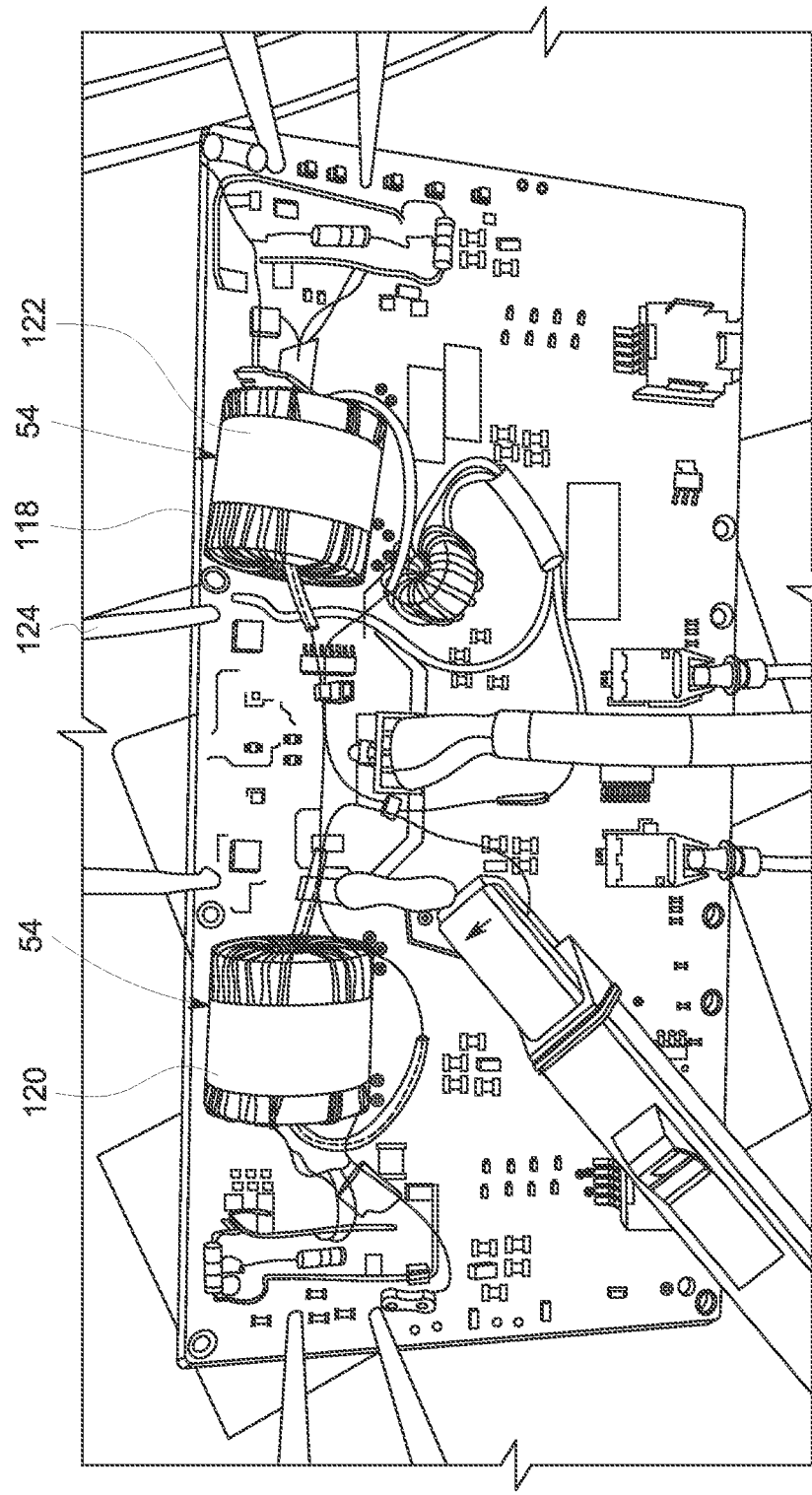
FIG. 13 is an image of an implementation of coreless transformers (e.g., current transformers) coupled to a gate driver board, in accordance with the present disclosure.

FIG. 13 is an image of an actual physical implementation of coreless transformers 54 (e.g., current transformers similar to transformer 54 in FIG. 6) coupled to a gate driver board 118. A current transformer 120 is coupled to an upper gate of the gate driver board 118. Also, a current transformer 122 is coupled to a lower gate of the gate driver board 118. The gate driver board 118 includes a primary bridge for the power supply with a fsw of 2.5 MHz and an inductor 124 in series with the primary.

Figure 14:
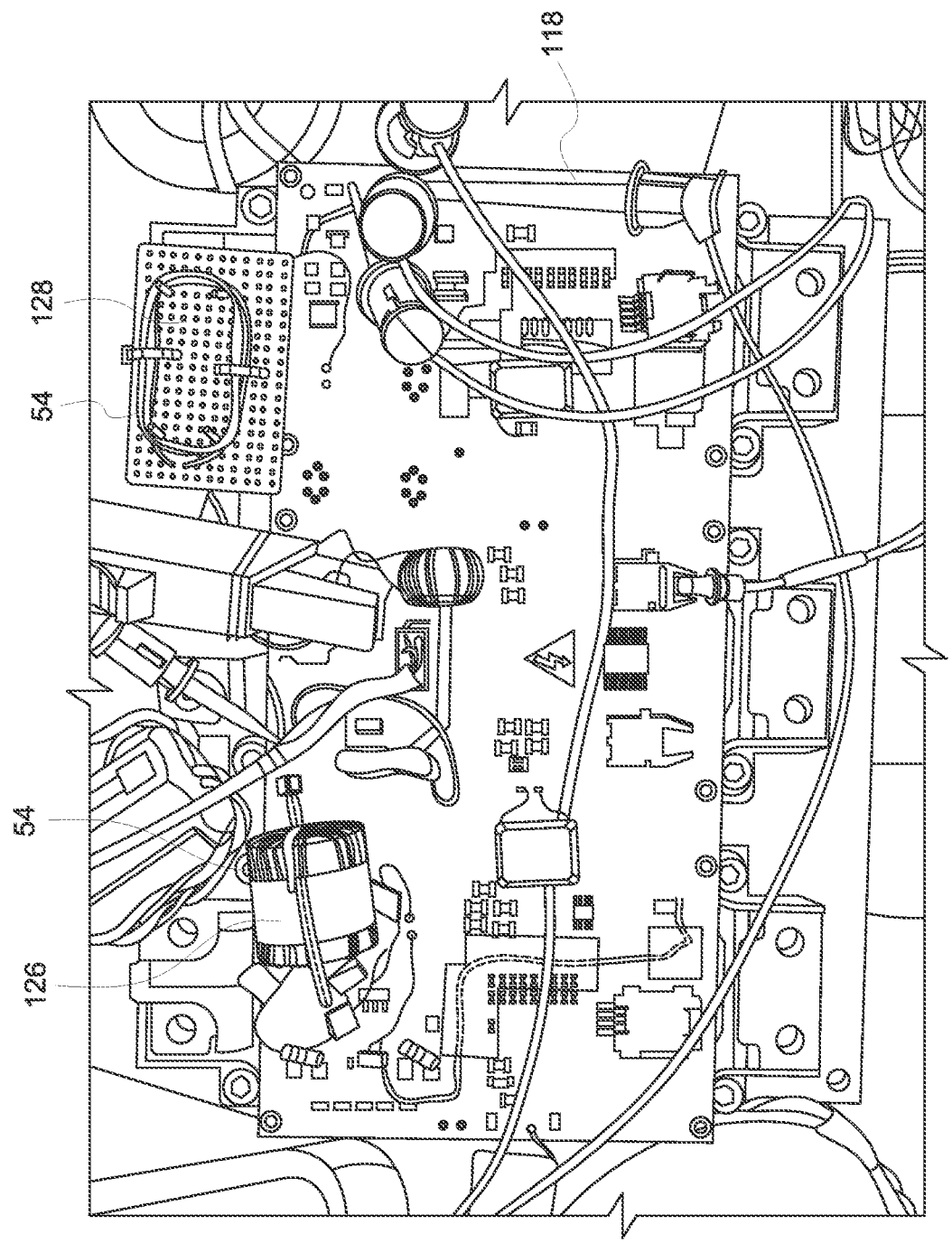
FIG. 14 is an image of an implementation of coreless transformers (e.g., current transformer and planar transformer) coupled to a gate driver board, in accordance with aspects of the present disclosure.

FIG. 14 is an image of an implementation of coreless transformers 54 (e.g., current transformer similar to transformer 54 in FIG. 6 and planar transformer similar to transformer 88 in FIG. 10) coupled to the gate driver board 118. A current transformer 126 is coupled to an upper gate of the gate driver board 118. Also, a planar transformer 128 is coupled to a lower gate of the gate driver board 118. The gate driver board 118 includes a primary bridge for the power supply with a fsw of 2.5 MHz. In certain embodiments, the current transformer 126 may be coupled to the lower gate of the gate driver board 118 and the planar transformer 128 may be coupled to the upper gate of the gate driver board 118. In certain embodiments, the planar transformer 128 may include a circular shape as described above.

Figure 15:
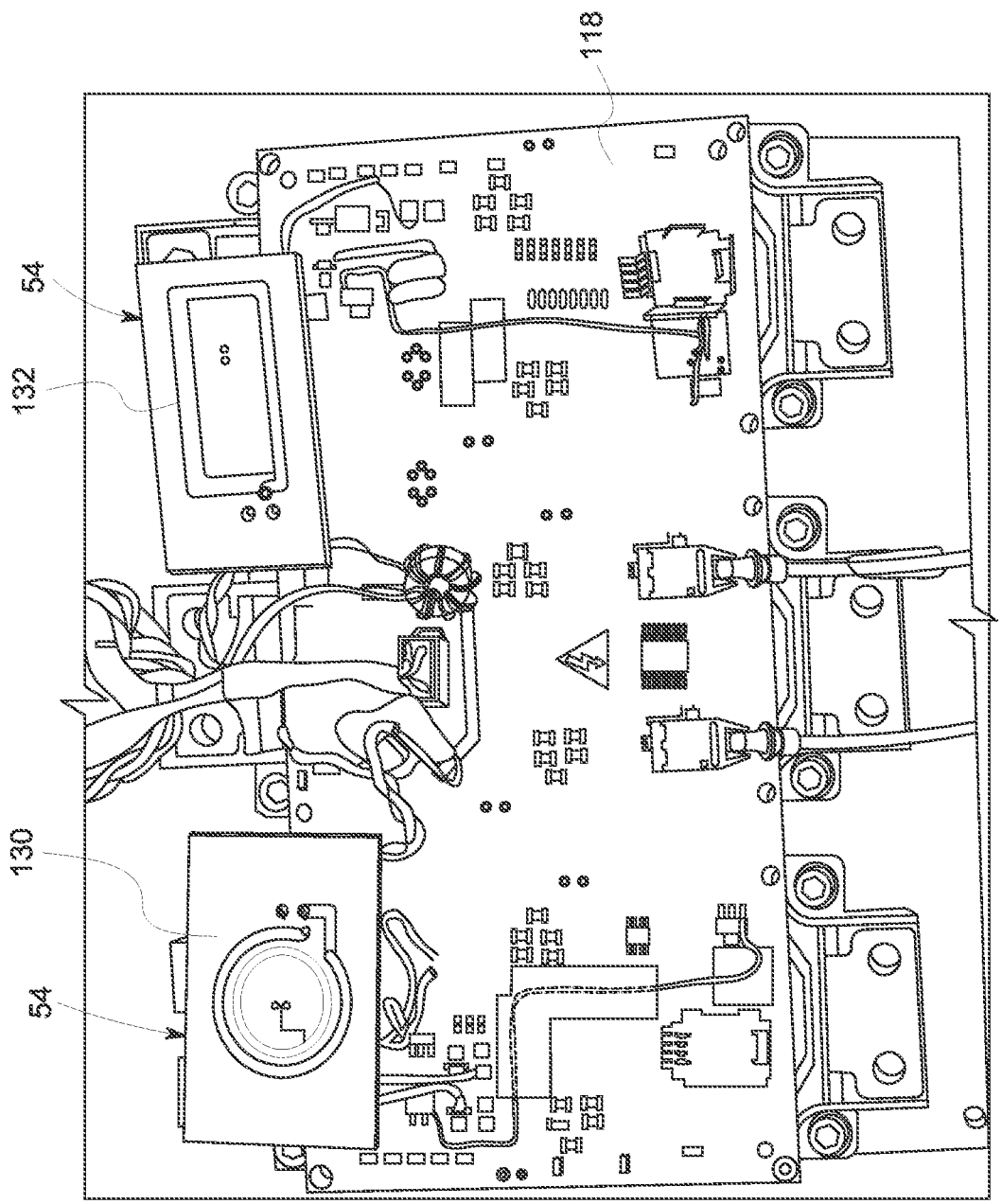
FIG. 15 is an image of an implementation of coreless transformers (e.g., planar transformers) coupled to a gate driver board, in accordance with aspects of the present disclosure.

FIG. 15 is an image of an implementation of coreless transformers 54 (e.g., planar transformers such as depicted in FIGS. 10 and 11) coupled to the gate driver board 18. A planar transformer 130 (e.g., having a circular shape similar to transformer 90 in FIG. 11) is coupled to an upper gate of the gate driver board 118. Also, a planar transformer 132 (e.g., having a rectangular shape similar to transformer 88 in FIG. 10) is coupled to a lower gate of the gate driver board 118. The gate driver board 118 includes a primary bridge for the power supply with a fsw of 2.5 MHz. In certain embodiments, the planar transformer 130 may be coupled to the lower gate of the gate driver board 118 and the planar transformer 132 may be coupled to the upper gate of the gate driver board 118. In certain embodiments, both of the coreless transformers 54 coupled to the upper gate and the lower gate, respectively, may be similar to planer transformer 130. In certain embodiments, both of the coreless transformers 54 coupled to the upper gate and the lower gate, respectively, may be similar to the planar transformer 132.

Figure 16:
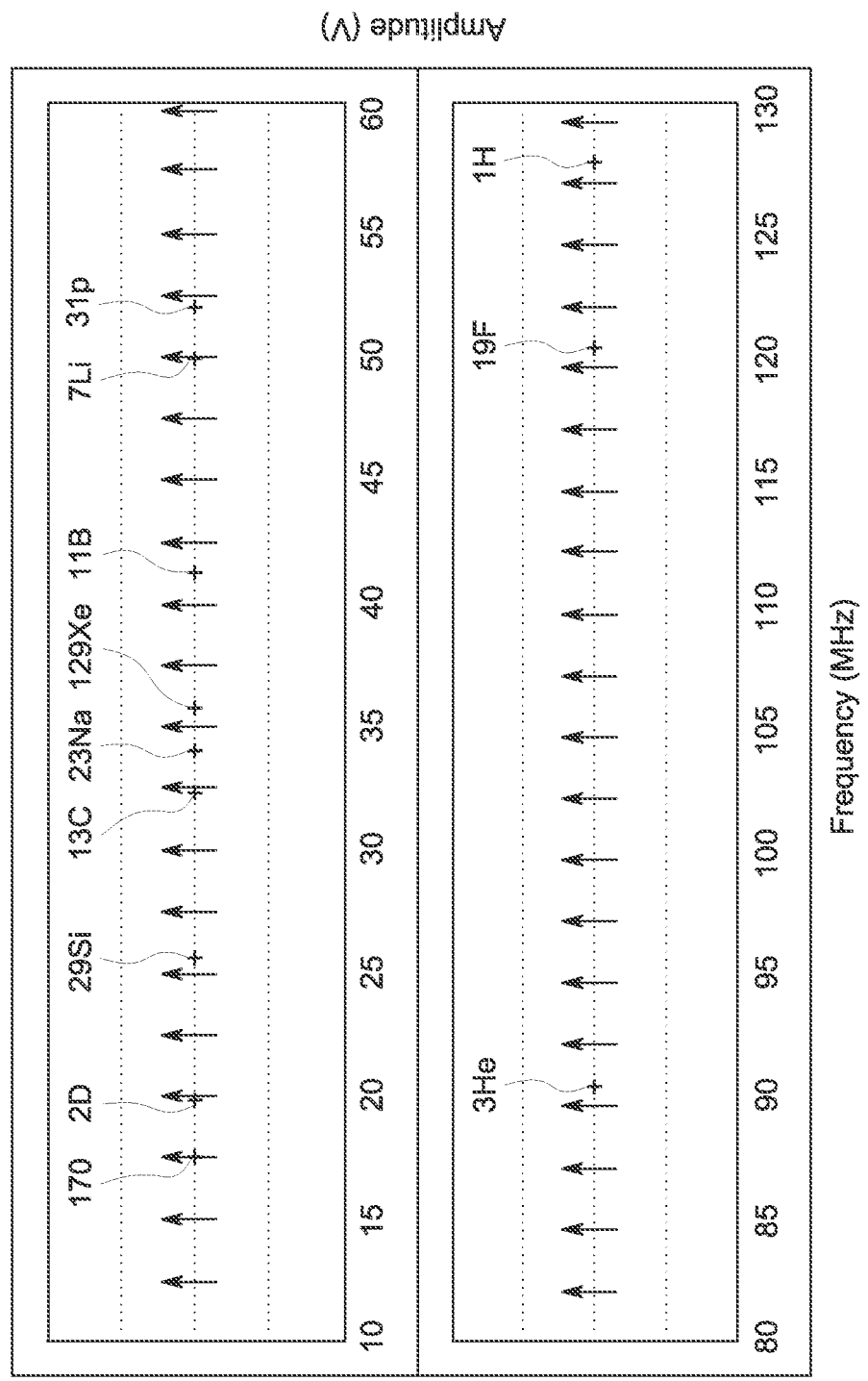
FIG. 16 is a plot of harmonics for a switching frequency of 2.498 MHz and the frequencies of several nuclei of interest for MRI.
Figure 17:
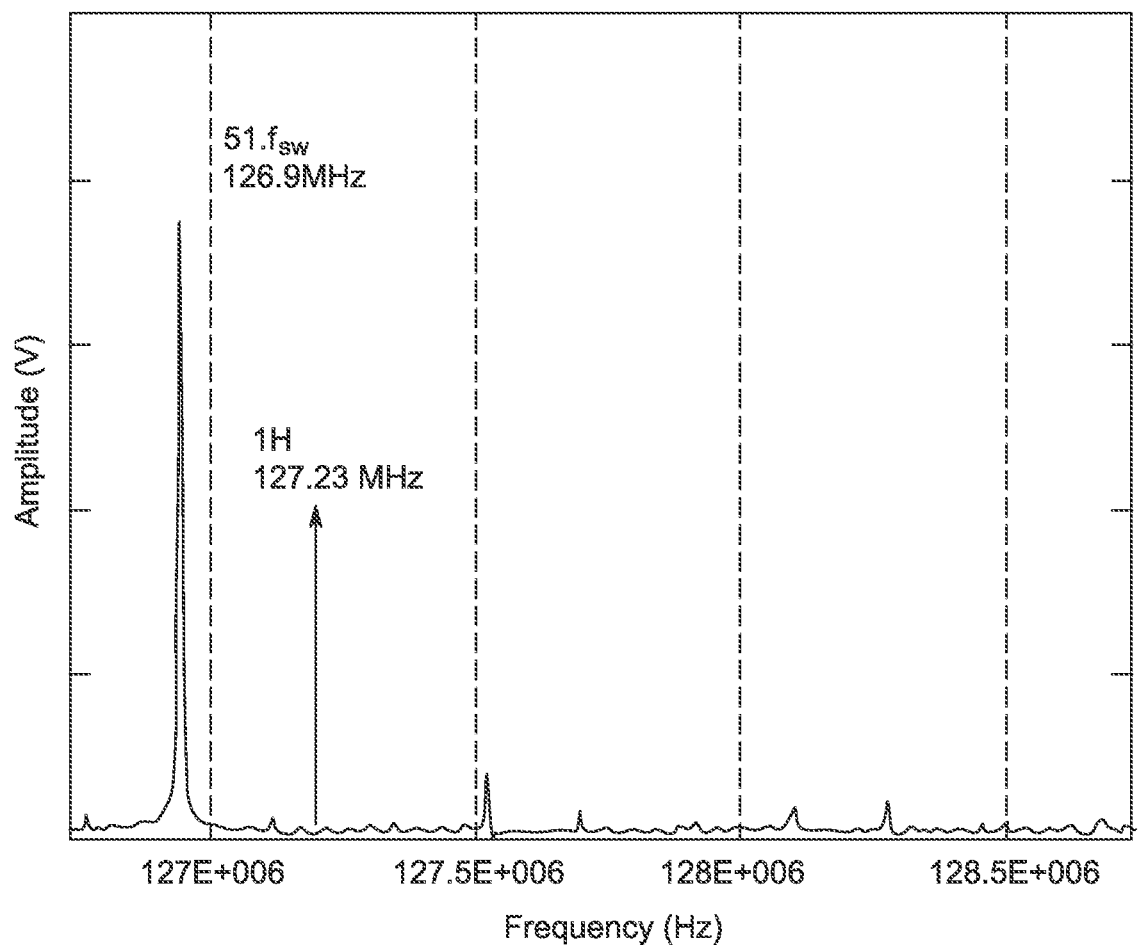
FIG. 17 is a zoom of the plot in FIG. 16 for the $51^{st}$ harmonic of the switching frequency and the proton ($^1$H) frequency.

As noted above, series-series compensation for these coreless transformers enables efficient power transfer and low power drop. High frequency driving or switching (e.g., utilizing a multi-Hz switching frequency) of the coreless transformers enables these transformers to be more compact. High switching frequency increases the electromagnetic radiation emitted from the gradient amplifier and its associated cabling, which may affect imaging. The selection of switching frequency must be such that it does not coincide with the frequencies of interest (i.e., the imaging frequency) utilized with the MRI scanner. Higher switching frequencies result in a larger frequency range between the harmonics. A switching frequency of 2.498 MHz enables a small size transformer. In addition, this switching frequency has harmonics that are MHz spaced and has a frequency margin larger than a digitization bandwidth. Power converters operate with pulse width modulation (PWM) to regulate output voltage. The harmonics of the PWM waveforms are plotted together with the frequencies of nuclei of interest in FIG. 16. The arrows in FIG. 16 indicate the harmonics of the switching frequency (i.e., 2.498 MHz). FIG. 16 also illustrates the frequencies of several nuclei of interest (e.g., MRI precession frequencies) that do not coincide with the harmonics of the switching frequency. For example, as shown in FIG. 17, the $51^{st}$ harmonic of the switching frequency (i.e., 2.498 MHz) is at 126.9 MHz, which more than 300 kHz lower than the proton frequency used for MRI (i.e., 127.23 MHz) with a 3T MRI system. In certain embodiments, a different switching frequency in the MHz range (e.g., multi-MHz range) may be utilized as long as it lack harmonics that coincide with an imaging frequency during an MRI scan. In certain embodiments, a wide-bandgap semiconductor transistor (e.g., GaN MOSFET) of an isolated gate driver power supply circuit and a resonance converter are configured to enable switching by the isolated gate driver power supply circuit at switching frequencies in the MHz range that lack harmonics that coincide with an imaging frequency during a magnetic resonance imaging scan.

Figure 18:
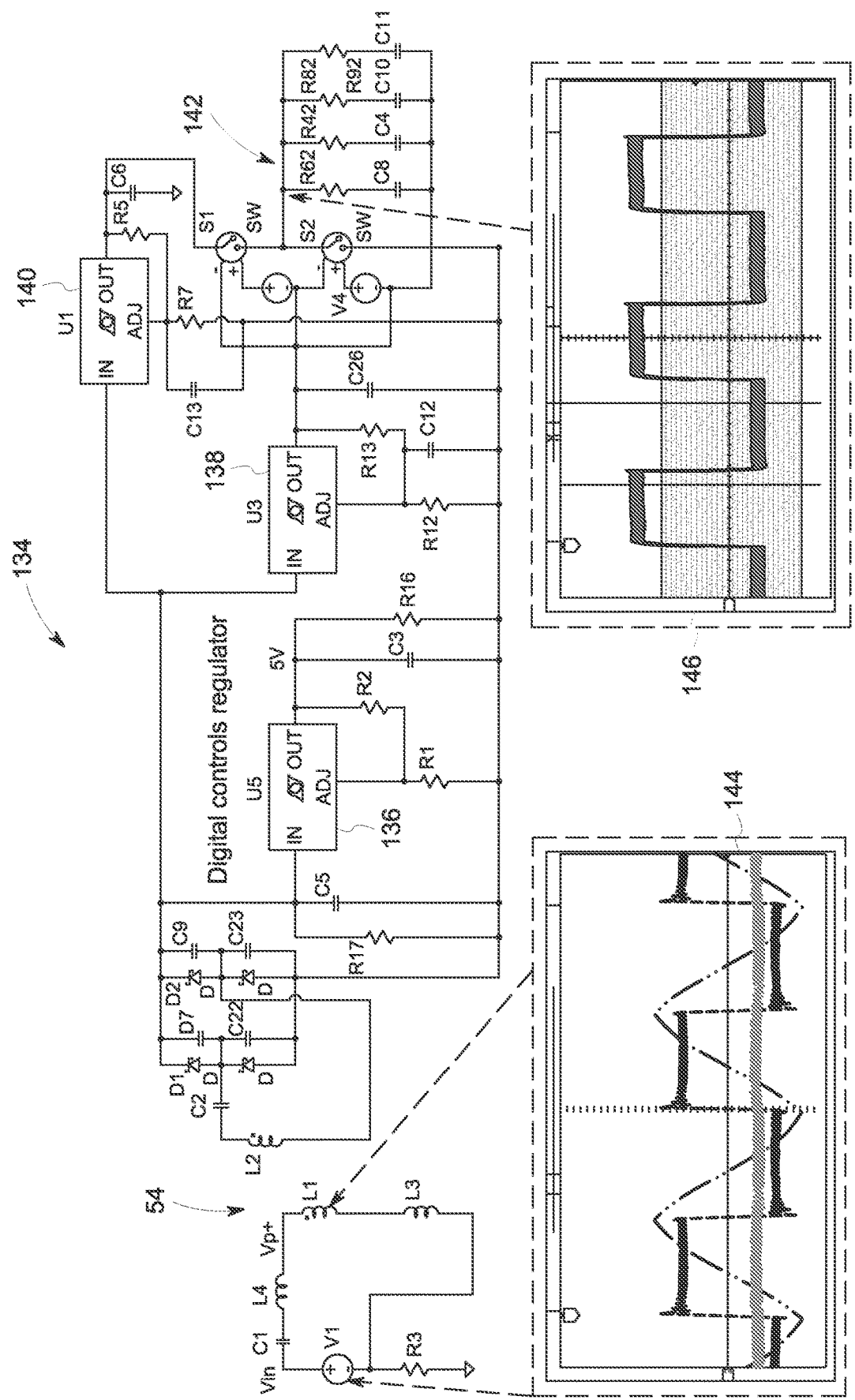
FIG. 18 is a schematic diagram of a gate driver circuit utilizing a coreless transformer (e.g., having a single output secondary) and images of associated waveforms, in accordance with aspects of the present disclosure.

FIG. 18 is a schematic diagram of a gate driver circuit 134 utilizing a coreless transformer 54 and images of associated waveforms. The coreless transformer 54 is as described in FIG. 4 and includes a single output secondary. The gate driver circuit 134 includes a number of linear regulators. For example, the gate driver circuit 134 includes a digital controls regulator 136. The gate driver circuit 134 also includes two regulators 138 and 140 for the gate drive. The gate driver circuit 134 includes a set of MOSFETs 142 (e.g., 4 MOSFETs 142) in parallel. A low voltage dc (e.g., with an input voltage (Vin of +15 V/−15 V) is utilized to drive the transformer 54 at 2.489 MHz. In image 144, the Vin and the input current (IL1) are displayed. In image 146, the output voltages (+15 V/−4 V) are displayed which are tuned to the set of MOSFETs 142. The gate return is shifted up by 4 V. The gate driver circuit 134 runs both the upper and lower drivers at 31.25 kHz. The coreless transformer 54 enables voltages to be produced on the secondary capable of providing voltage of +15 V and −4 V for a gate driver using the linear regulators 134, 138, and 140 and without exceeding the component ratings of the components at no load (e.g., less than 30 V).

Figure 19A:
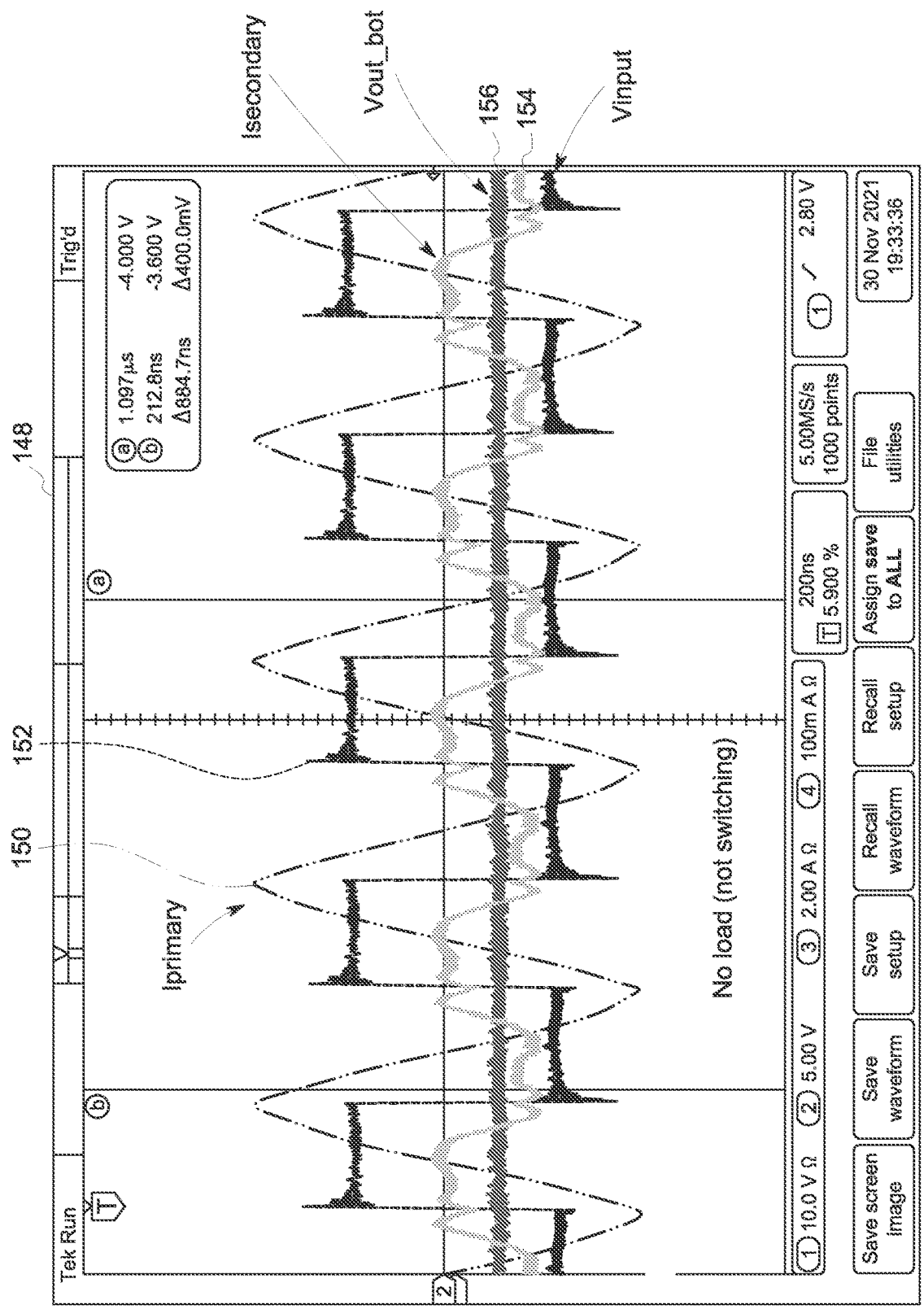
FIGS. 19A-C are images of associated waveforms with a gate driver circuit utilizing a coreless transformer (e.g., a planar transformer with a rectangular shape as described in FIG. 10), in accordance with aspects of the present disclosure.
Figure 19B:
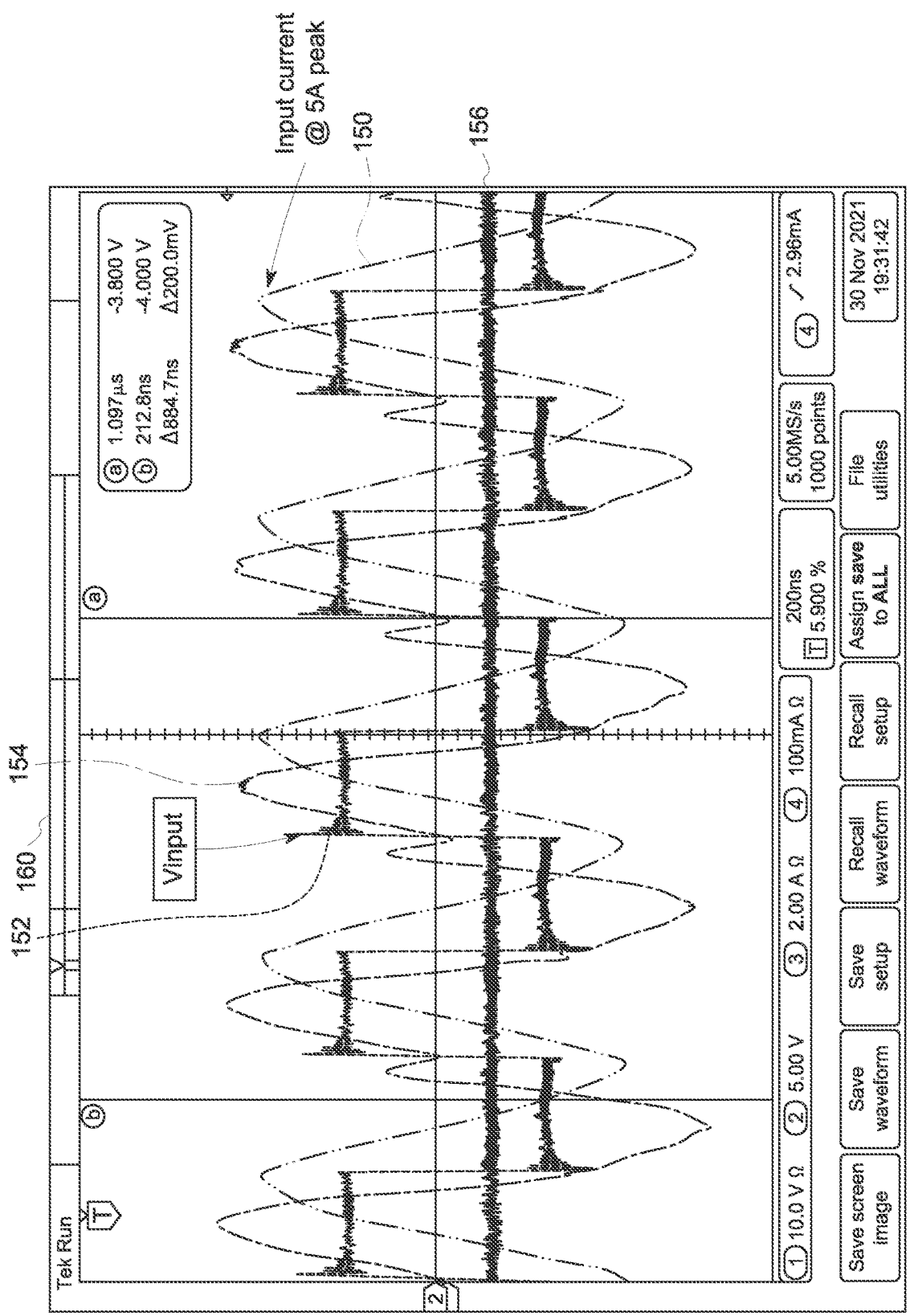
Figure 19C:
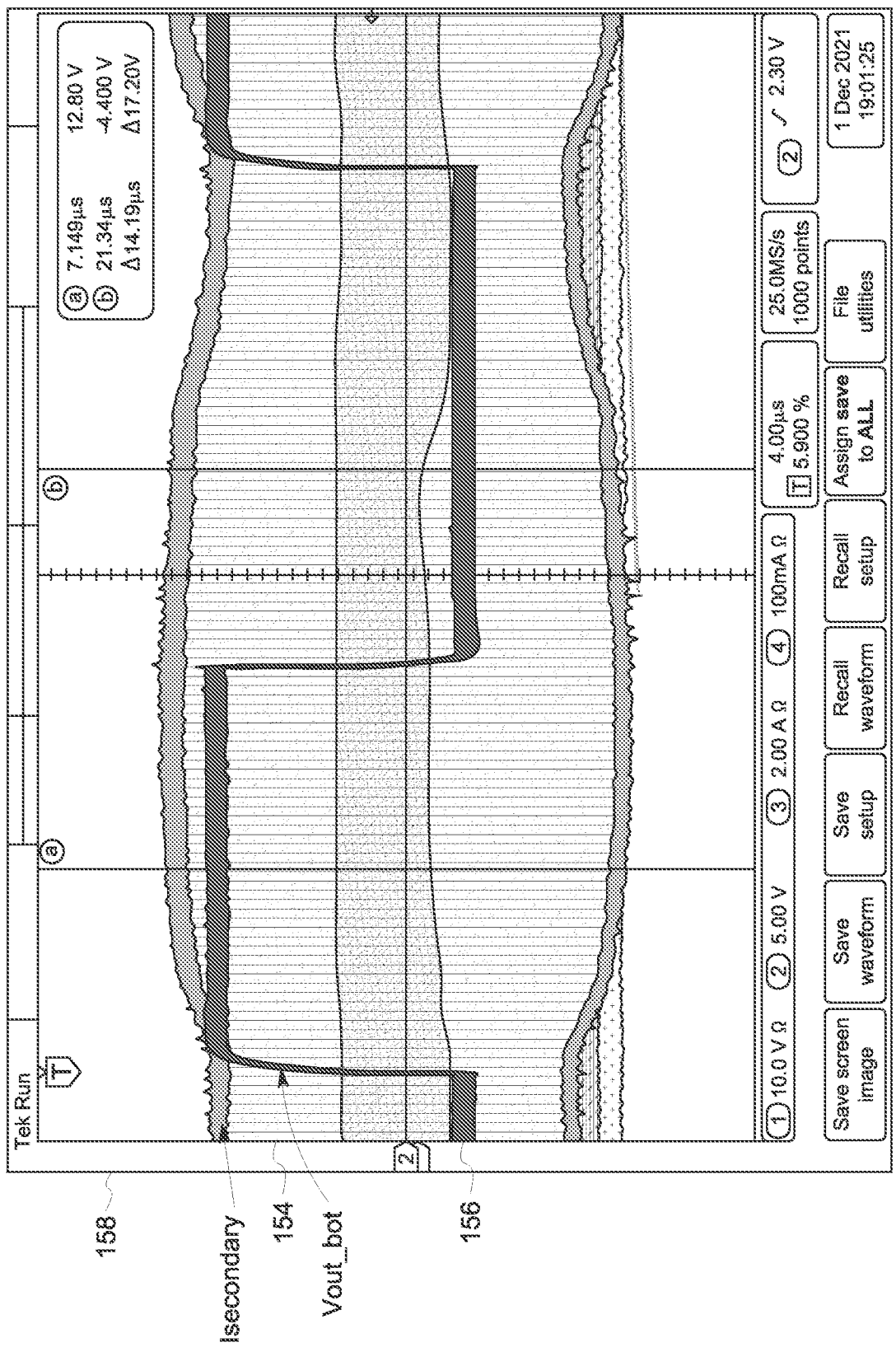

FIGS. 19A-C are images of associated waveforms with a gate driver circuit utilizing a coreless transformer (e.g., a planar transformer with a rectangular shape as described in FIG. 10). Image 148 in FIG. 19A illustrates the primary current 150 (e.g., input current), the input voltage 152 (Vinput), the secondary current 154 (Isecondary), and the voltage out of the bottom or lower gate of the gate driver circuit 156 (Vout_bot) with no load (i.e., not switching). Image 158 in FIG. 19C illustrates the secondary current 154 and the voltage out of the bottom gate of the gate driver circuit 156 during full load (with 31.25 kHz switching). Image 160 in FIG. 19B illustrates the primary current 150, the input voltage 152, the secondary current 154, and the voltage out of the bottom gate of the gate driver circuit 156 during full load (with 31.25 kHz switching). The voltage after the bridge with no load is 21.99 V. The voltage after the bridge with full load is 20.65 V. The regulator outputs at no load is +19 V, −4 V and full load+18.54 V and −4V. At full load (with 31.25 kHz switching), the maximum output swing is +14.46 V/−4 V. This output signal can be tuned to obtain the desired level by increasing the input current, which can be done by reducing the input inductance of the primary coil, or by getting the secondary frequency tuned closer to 2.48 MHz. In image 160, the input current peaks at 5 A. The waveforms acquired in the images 148, 158, and 160 are with the low voltage dropout regulator on +19 V.

Figure 20:
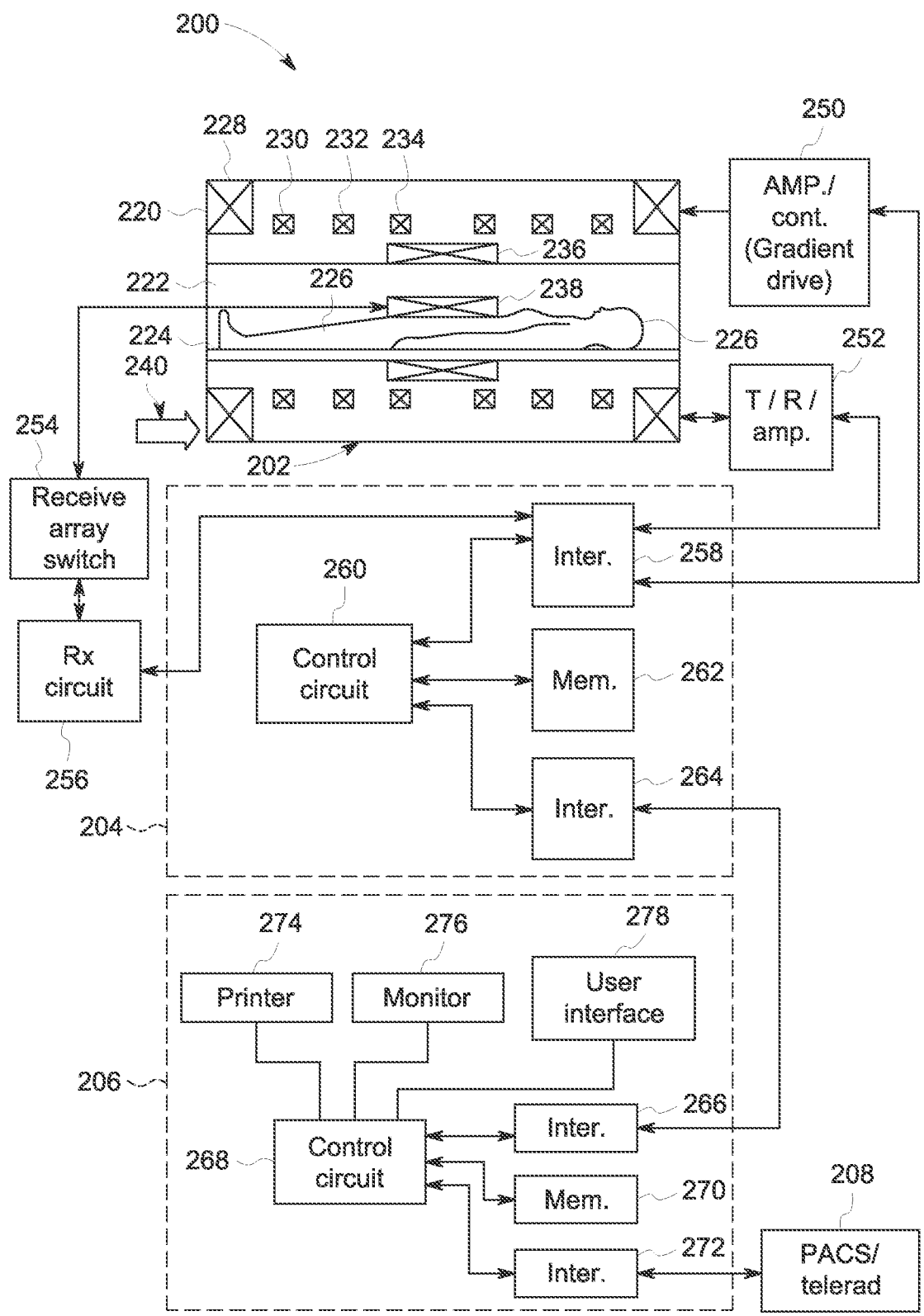
FIG. 20 illustrates an embodiment of an MRI system suitable for use with the disclosed techniques.

With the preceding in mind, in FIG. 20 a magnetic resonance imaging (MRI) system 200 is illustrated schematically as including a scanner 202, scanner control circuitry 204, and system control circuitry 206. According to the embodiments described herein, the MRI system 200 is generally configured to perform MR imaging.

System 200 additionally includes remote access and storage systems or devices such as picture archiving and communication systems (PACS) 208, or other devices such as teleradiology equipment so that data acquired by the system 200 may be accessed on- or off-site. In this way, MR data may be acquired, followed by on- or off-site processing and evaluation. While the MRI system 200 may include any suitable scanner or detector, in the illustrated embodiment, the system 200 includes a full body scanner 202 having a housing 220 through which a bore 222 is formed. A table 224 is moveable into the bore 222 to permit a patient 226 to be positioned therein for imaging selected anatomy within the patient.

Scanner 202 includes a series of associated coils for producing controlled magnetic fields for exciting the gyromagnetic material within the anatomy of the subject being imaged. Specifically, a primary magnet coil 228 is provided for generating a primary magnetic field, B0, which is generally aligned with the bore 222. A series of gradient coils 230, 232, and 234 permit controlled magnetic gradient fields to be generated for positional encoding of certain of the gyromagnetic nuclei within the patient 226 during examination sequences. A radio frequency (RF) coil 236 (e.g., RF transmit coil) is configured to generate radio frequency pulses for exciting the certain gyromagnetic nuclei within the patient. In addition to the coils that may be local to the scanner 202, the system 200 also includes a set of receiving coils or RF receiving coils 238 (e.g., an array of coils) configured for placement proximal (e.g., against) to the patient 226. As an example, the receiving coils 238 can include cervical/thoracic/lumbar (CTL) coils, head coils, single-sided spine coils, and so forth. In certain embodiments, the RF receiving coils 238 may be part of a multi-stage coil disposed about an extremity (e.g., arm or leg) of the patient 226 as described below. Generally, the receiving coils 238 are placed close to or on top of the patient 226 so as to receive the weak RF signals (weak relative to the transmitted pulses generated by the scanner coils) that are generated by certain of the gyromagnetic nuclei within the patient 226 as they return to their relaxed state.

The various coils of system 200 are controlled by external circuitry to generate the desired field and pulses, and to read emissions from the gyromagnetic material in a controlled manner. In the illustrated embodiment, a main power supply 240 provides power to the primary field coil 228 to generate the primary magnetic field, Bo. A power input 244 (e.g., power from a utility or grid), a power distribution unit (PDU), a power supply (PS), and a driver circuit 250 may together provide power to pulse the gradient field coils 230, 232, and 234. The driver circuit 250 (e.g., gradient driver as described above) may include amplification and control circuitry for supplying current to the coils as defined by digitized pulse sequences output by the scanner control circuit 204.

Another control circuit 252 is provided for regulating operation of the RF coil 236. Circuit 252 includes a switching device for alternating between the active and inactive modes of operation, wherein the RF coil 236 transmits and does not transmit signals, respectively. Circuit 252 also includes amplification circuitry configured to generate the RF pulses. Similarly, the receiving coils 238 are connected to switch 254, which is capable of switching the receiving coils 238 between receiving and non-receiving modes. Thus, the receiving coils 238 resonate with the RF signals produced by relaxing gyromagnetic nuclei from within the patient 226 while in the receiving mode, and they do not resonate with RF energy from the transmitting coils (i.e., coil 236) so as to prevent undesirable operation while in the non-receiving mode. Additionally, a receiving circuit 256 is configured to receive the data detected by the receiving coils 238 and may include one or more multiplexing and/or amplification circuits.

It should be noted that while the scanner 202 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 204, 206.

As illustrated, scanner control circuit 204 includes an interface circuit 258, which outputs signals for driving the gradient field coils and the RF coil and for receiving the data representative of the magnetic resonance signals produced in examination sequences. The interface circuit 258 is coupled to a control and analysis circuit 260. The control and analysis circuit 260 executes the commands for driving the circuit 250 and circuit 252 based on defined protocols selected via system control circuit 206.

Control and analysis circuit 260 also serves to receive the magnetic resonance signals and performs subsequent processing before transmitting the data to system control circuit 206. Scanner control circuit 204 also includes one or more memory circuits 262, which store configuration parameters, pulse sequence descriptions, examination results, and so forth, during operation.

Interface circuit 264 is coupled to the control and analysis circuit 260 for exchanging data between scanner control circuit 204 and system control circuit 206. In certain embodiments, the control and analysis circuit 260, while illustrated as a single unit, may include one or more hardware devices. The system control circuit 206 includes an interface circuit 266, which receives data from the scanner control circuit 204 and transmits data and commands back to the scanner control circuit 204. The control and analysis circuit 268 may include a CPU in a multi-purpose or application specific computer or workstation. Control and analysis circuit 268 is coupled to a memory circuit 270 to store programming code for operation of the MRI system 200 and to store the processed image data for later reconstruction, display and transmission. The programming code may execute one or more algorithms that, when executed by a processor, are configured to perform reconstruction of acquired data as described below. In certain embodiments, the memory circuit 270 may store one or more neural networks for reconstruction of acquired data as described below. In certain embodiments, image reconstruction may occur on a separate computing device having processing circuitry and memory circuitry.

An additional interface circuit 272 may be provided for exchanging image data, configuration parameters, and so forth with external system components such as remote access and storage devices 208. Finally, the system control and analysis circuit 268 may be communicatively coupled to various peripheral devices for facilitating operator interface and for producing hard copies of the reconstructed images. In the illustrated embodiment, these peripherals include a printer 274, a monitor 276, and user interface 278 including devices such as a keyboard, a mouse, a touchscreen (e.g., integrated with the monitor 276), and so forth.

Technical effects of the disclosed embodiments include providing a gate driver (e.g., as part of a gradient driver system) that includes an isolated gate driver power supply circuit that includes a coreless transformer (e.g., air core transformer). The air core transformer has high field compatibility. In addition, the geometry of the air core transformer enables good magnetic coupling for delivering power. The air core transformer provides good power density (i.e., a reasonable footprint with no added thermal management). In addition, the air core transformer may be utilized with high frequency operation with low switching losses and zero voltage switching.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A gate driver circuit, comprising:
   an isolated gate driver power supply circuit, comprising:
      a coreless transformer comprising a primary winding and a secondary winding, wherein the secondary winding is wound about a toroid-shaped, non-magnetic body and the primary winding is a single turn primary winding to reduce capacitance coupling between the primary winding and the secondary winding; and
      a resonance converter coupled to the coreless transformer, wherein the resonance converter is configured to enable the isolated gate driver power supply circuit to generate an output voltage independent of load.

2. The gate driver circuit of claim 1, wherein the primary winding and the secondary winding are magnetically coupled together.

3. The gate driver circuit of claim 1, wherein the resonance converter comprises a plurality of capacitors, and the plurality of capacitors comprises a first capacitor and a second capacitor respectively coupled to the primary winding and the secondary winding in series.

4. The gate driver circuit of claim 3, wherein the resonance converter is configured to compensate for leakage inductance of the coreless transformer.

5. The gate driver circuit of claim 1, wherein the resonance converter is configured to enable zero voltage switching by the isolated gate driver power supply circuit.

6. The gate driver circuit of claim 1, wherein the isolated gate driver power supply circuit comprises a coreless inductor coupled to the primary winding in series, wherein the coreless inductor is configured to limit a current of the primary winding.

7. The gate driver circuit of claim 1, wherein the coreless transformer comprises an additional secondary winding wound about a separate toroid-shaped, non-magnetic body, wherein the secondary winding is a high voltage winding and the additional secondary winding is a low voltage winding.

8. The gate driver circuit of claim 1, wherein the isolated gate driver power supply circuit comprises a wide-bandgap semiconductor transistor coupled to the coreless transformer, and wherein both the wide-bandgap semiconductor transistor and the resonance converter are configured to enable switching by the isolated gate driver power supply circuit at switching frequencies in a megahertz (MHz) range that lack harmonics that coincide with an imaging frequency during a magnetic resonance imaging scan.

* * * * *